US012772646B2

(12) United States Patent
Lin et al.

(10) Patent No.: US 12,772,646 B2
(45) Date of Patent: Oct. 20, 2026

(54) PACKAGE STRUCTURE WITH SUPPORTING FRAME

(71) Applicants: LITE-ON OPTO TECHNOLOGY (CHANGZHOU) CO., LTD., Changzhou City (CN); LITE-ON TECHNOLOGY CORPORATION, Taipei City (TW)

(72) Inventors: Chen-Hsiu Lin, New Taipei City (TW); Cheng-Ying Lee, New Taipei City (TW); Ming-Sung Tsai, Taipei City (TW)

(73) Assignees: LITE-ON OPTO TECHNOLOGY (CHANGZHOU) CO., LTD., Changzhou City (CN); LITE-ON TECHNOLOGY CORPORATION, Taipei City (TW)

( * ) Notice: Subject to any disclaimer, the term of this patent is extended or adjusted under 35 U.S.C. 154(b) by 0 days.

(21) Appl. No.: 18/628,912

(22) Filed: Apr. 8, 2024

(65) Prior Publication Data

US 2024/0247773 A1 Jul. 25, 2024

Related U.S. Application Data

(63) Continuation of application No. 17/216,827, filed on Mar. 30, 2021, now Pat. No. 11,959,606.
(Continued)

(30) Foreign Application Priority Data

Nov. 27, 2020 (CN) ......................... 202011357599.6

(51) Int. Cl.
*H10H 29/853* (2025.01)
*F21S 41/19* (2018.01)
(Continued)

(52) U.S. Cl.
CPC ......... *H10H 29/853* (2025.01); *F21S 41/192* (2018.01); *F21V 23/005* (2013.01);
(Continued)

(58) Field of Classification Search
CPC ......... H01L 24/02–09; H01L 2224/02–09519; H10H 29/853; H10H 20/853;
(Continued)

(56) References Cited

U.S. PATENT DOCUMENTS 10,950,769 B2 * 3/2021 Bergmann ......... H10H 20/8506
11,222,998 B2 * 1/2022 Ichinokura ........... H10H 20/854
(Continued)

FOREIGN PATENT DOCUMENTS

CN 107919426 A * 4/2018 ........... H01L 33/005

OTHER PUBLICATIONS

China Patent Office, Notice of Allowance issued on Oct. 16, 2024 for CN application No. 202011357599.6.

*Primary Examiner* — Ismail A Muse
(74) *Attorney, Agent, or Firm* — Li & Cai Intellectual Property (USA) Office

(57) ABSTRACT

A package structure includes a carrier, a frame, and at least one photonic device. The carrier includes a substrate and a plurality of first metal pads and second metal pads. The substrate includes a first surface and a second surface that are opposite to each other. The first metal pads are disposed on the first surface. The second metal pads are disposed on the second surface. A thickness of each of the second metal pads is greater than that of each of the first metal pads. The frame is disposed on the carrier, and an accommodating space is formed between the frame and the carrier. The at least one photonic device is disposed in the accommodating space.

17 Claims, 15 Drawing Sheets

Related U.S. Application Data

(60) Provisional application No. 63/002,394, filed on Mar. 31, 2020.

(51) Int. Cl.

| | |
|---|---|
| ***F21V 23/00*** | (2015.01) |
| ***H10H 29/85*** | (2025.01) |
| ***H10W 90/00*** | (2026.01) |
| *F21W 107/00* | (2018.01) |

(52) U.S. Cl.
CPC .......... *H10H 29/857* (2025.01); *H10W 90/00* (2026.01); *F21W 2107/00* (2018.01)

(58) Field of Classification Search
CPC ... H10H 29/857; H10H 20/857; F21S 41/192; F21V 23/005; H10W 90/00; F21W 2107/00
See application file for complete search history.

(56) References Cited

U.S. PATENT DOCUMENTS

| | | | | |
|---|---|---|---|---|
| 11,764,335 | B2 * | 9/2023 | Uratani | H10H 20/855 257/99 |
| 2005/0185419 | A1 * | 8/2005 | Holman | G02B 5/045 362/555 |
| 2008/0043444 | A1 * | 2/2008 | Hasegawa | H05K 1/0206 361/717 |
| 2009/0045423 | A1 * | 2/2009 | Hashimoto | H10H 20/856 257/E33.068 |
| 2010/0308697 | A1 * | 12/2010 | Aratake | H03H 9/21 29/25.35 |
| 2011/0049545 | A1 * | 3/2011 | Basin | H01L 24/97 257/E33.061 |
| 2013/0193464 | A1 * | 8/2013 | Bae | H10H 20/835 257/94 |
| 2017/0162755 | A1 * | 6/2017 | Su | H01L 24/10 |
| 2017/0263833 | A1 * | 9/2017 | Chiu | H10H 20/8506 |
| 2018/0145232 | A1 * | 5/2018 | Hashimoto | H10H 20/8514 |
| 2018/0366623 | A1 * | 12/2018 | Cheng | H10H 20/8506 |
| 2019/0189861 | A1 * | 6/2019 | Ichinokura | H10H 20/8506 |
| 2019/0189870 | A1 * | 6/2019 | Ichinokura | H10H 20/8506 |
| 2019/0259925 | A1 * | 8/2019 | Francis | H10H 20/856 |
| 2021/0050483 | A1 * | 2/2021 | Bilenko | H10H 20/857 |
| 2022/0165929 | A1 * | 5/2022 | Miki | H10H 20/857 |

* cited by examiner

PACKAGE STRUCTURE WITH SUPPORTING FRAME

CROSS-REFERENCE TO RELATED PATENT APPLICATION

This application is a continuation application of the U.S. application Ser. No. 17/216,827, filed on Mar. 30, 2021 and entitled "PACKAGE STRUCTURE WITH SUPPORTING FRAME", now issued as U.S. Pat. No. 11,959,606, which claims priorities to the U.S. Provisional Patent Application Ser. No. 63/002,394 filed on Mar. 31, 2020 and China Patent Application No. 202011357599.6, filed on Nov. 27, 2020 in People's Republic of China. The entire content of the above identified applications are incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a package structure including a cushion wall.

BACKGROUND OF THE DISCLOSURE

Currently, package structures in headlights are usually encapsulated by white resin. However, during an encapsulating process, since the package structure is generally smaller in size, a thickness of the white resin can easily be too thin, so that the supportability provided by the white resin is insufficient. During a mounting process, when the package structures are moved by using suction nozzles and then fixed on circuit boards, the white resin is usually unable to withstand the pressure of the suction nozzles during the mounting process, causing the white resin to be damaged and leading to leakage of blue light.

Therefore, it has become an important issue in the industry to enhance the structural strength of the package structure, and further strengthen the supportability of the white resin (i.e., encapsulant), so as to overcome the above inadequacies.

SUMMARY OF THE DISCLOSURE

In response to the above-referenced technical inadequacies, the present disclosure provides a package structure including a carrier, a frame, and at least one photonic device. The carrier includes a substrate and a plurality of first metal pads and second metal pads. The substrate includes a first surface and a second surface that are opposite to each other. The first metal pads are disposed on the first surface. The second metal pads are disposed on the second surface. A thickness of each of the second metal pads is greater than that of each of the first metal pads. The frame is disposed on the carrier, and an accommodating space is formed between the frame and the carrier. The at least one photonic device is disposed in the accommodating space.

In one aspect, the present disclosure provides a package structure including a carrier, at least one photonic device, and a frame. The at least one photonic device is disposed on the carrier. The frame is disposed on the carrier and surrounds the at least one photonic device. The frame is a multi-layer metal structure which is tapered from bottom to top, and a tapered side of the frame is facing away from the at least one photonic device. A distance is defined between an outer edge of the frame and the edge of the carrier.

In another aspect, the present disclosure provides a package structure including a carrier, a frame, and at least one photonic device. The carrier includes a substrate and a plurality of first metal pads. The frame is disposed on the carrier, and an accommodating space is formed between the frame and the carrier. The at least one photonic device is disposed in the accommodating space. A first distance is between two of the first metal pads that are adjacent to each other. A second distance is between the frame and an adjacent one of the first metal pads. A third distance is between the outer edge of the frame and an edge of the carrier. The first distance, the second distance, and the third distance are all greater than or equal to 0.05 millimeters.

One of the beneficial effects of the present disclosure is that the package structure provided by the present disclosure can improve the structural strength of the package structure and enhance the supportability of the encapsulant through the technical solution of "the frame disposed on the carrier", thereby improving the luminous efficiency of the package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
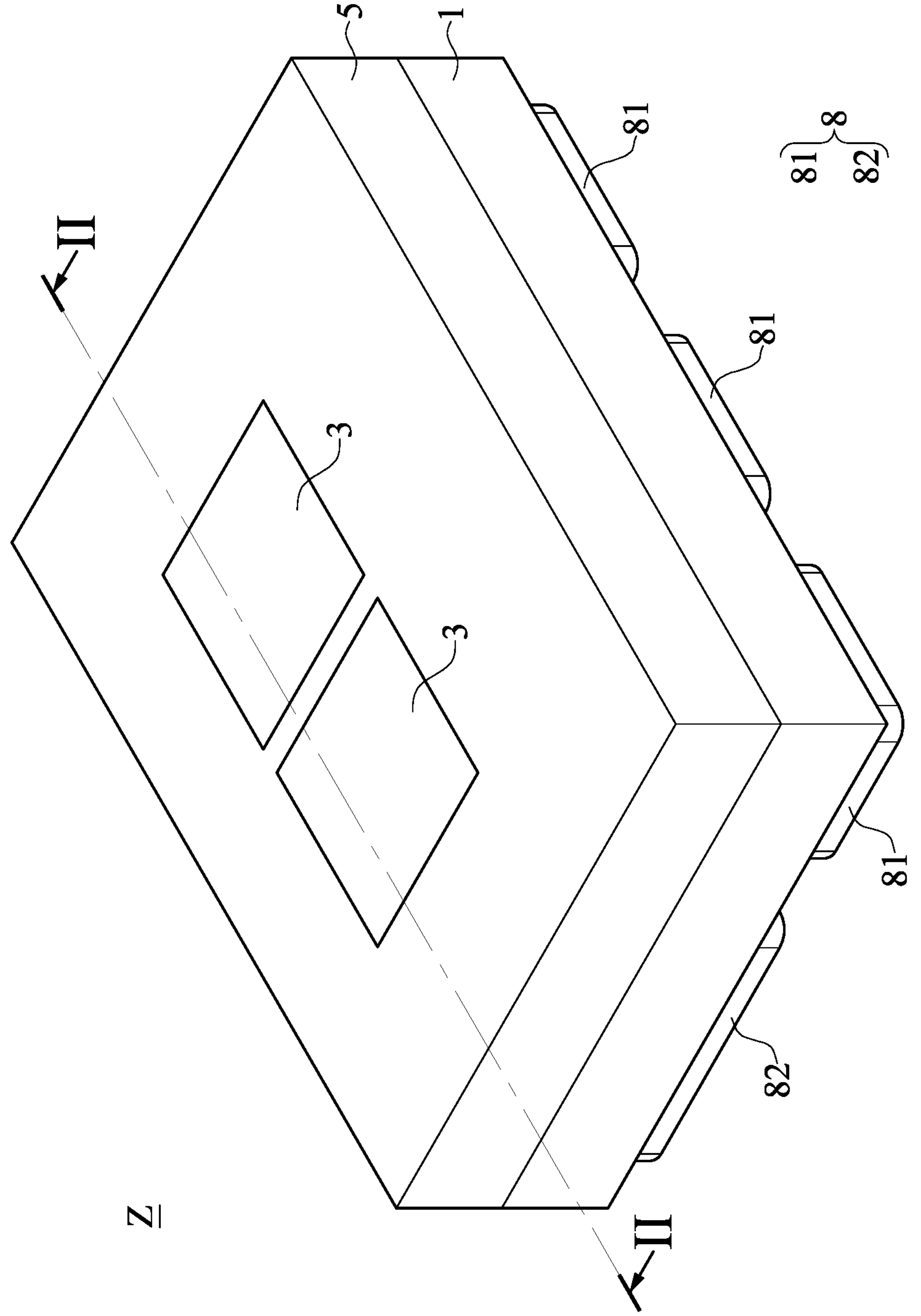
FIG. 1 is a perspective schematic view of a package structure in a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of “a”, “an”, and “the” includes plural reference, and the meaning of “in” includes “in” and “on”. Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as “first”, “second” or “third” can be used to describe various components, signals or the like, which are for distinguishing one component/signal from another one only, and are not intended to, nor should be construed to impose any substantive limitations on the components, signals or the like.

First Embodiment

Figure 2:
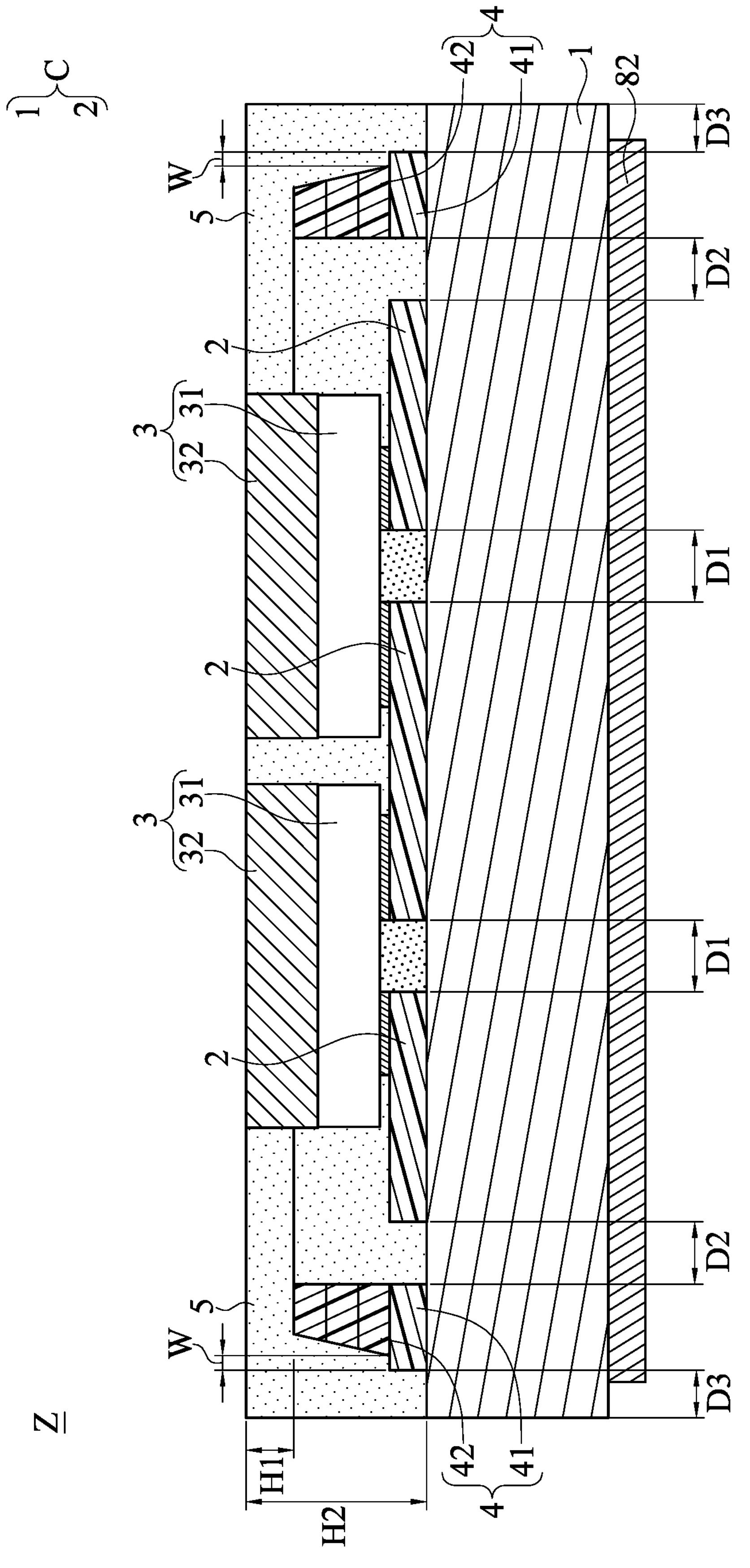
FIG. 2 is a cross-sectional view taken along line II-II of FIG. 1.
Figure 3:
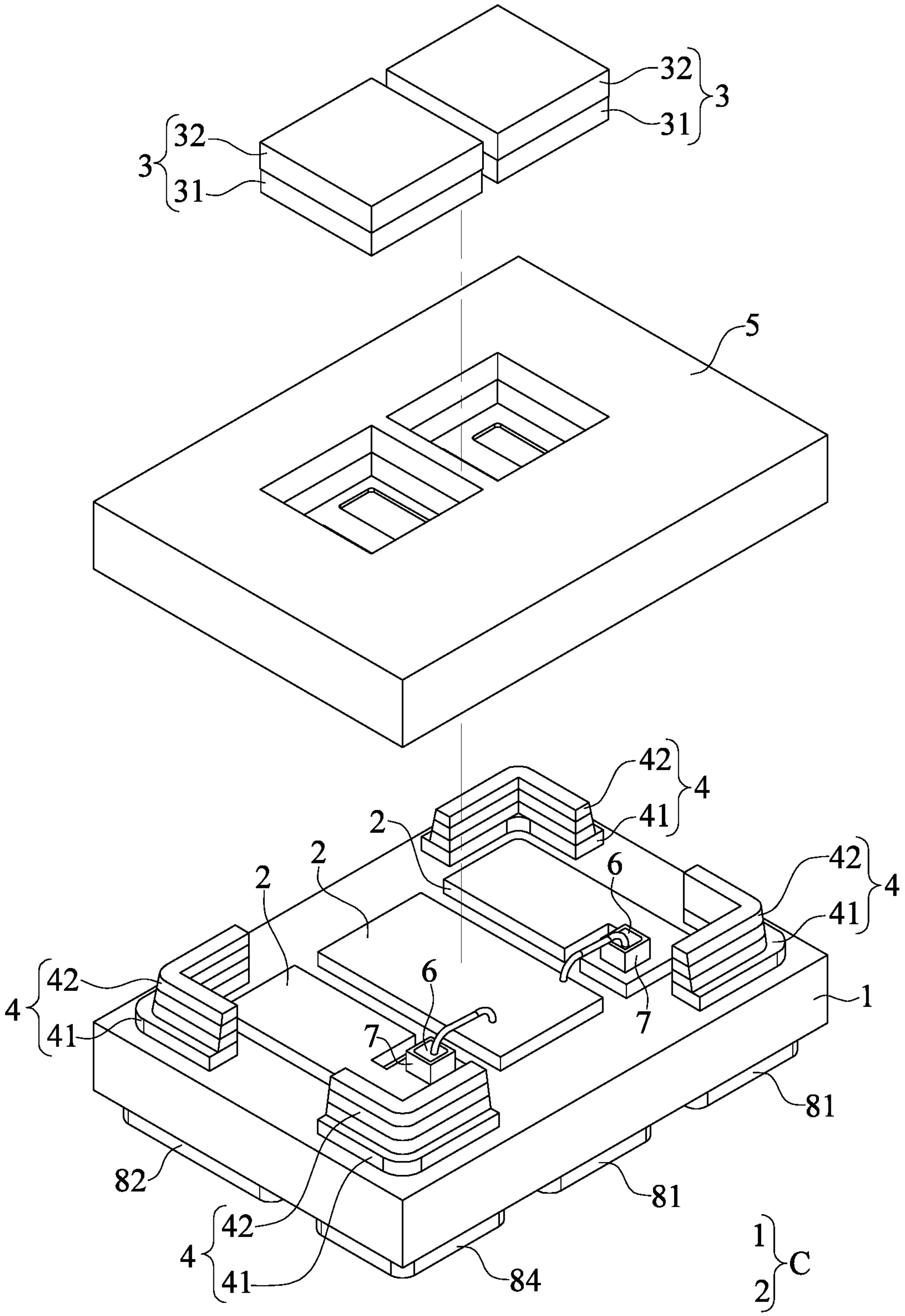
FIG. 3 is an exploded perspective schematic view of the package structure in the first embodiment of the present disclosure.

Firstly, referring to FIG. 1, FIG. 2 and FIG. 3, a package structure Z is provided in the first embodiment of the present disclosure, and includes a carrier C, at least one photonic device 3, a supporting frame 4, and an encapsulant 5. The at least one photonic device 3 is disposed on the carrier C. The supporting frame 4 is disposed on the carrier C and surrounds the at least one photonic device 3.

Specifically speaking, the carrier C includes a substrate 1 and at least one first metal pad 2, and the material of the substrate 1 can be, for example, a ceramic material, but the present disclosure is not limited thereto. The at least one first metal pad 2 is disposed on the substrate 1. The at least one photonic device 3 is disposed on the at least one first metal pad 2. In this embodiment, the quantity of the at least one photonic device 3 is two (i.e., dual chips), but the present disclosure is not limited thereto, and the quantity of the at least one photonic device 3 can be one or more than one. The supporting frame 4 is disposed on the substrate 1. A range of emitted light of the light having the mixed predetermined color (i.e., the second color) emitted by the at least one photonic device 3 can be concentrated through the four portions 40, thereby improving the luminous efficiency of the package structure Z.

References are further made to FIG. 1 and FIG. 2. The encapsulant 5 covers the supporting frame 4 and surrounds the at least one photonic device 3. A top of the at least one photonic device 3 is exposed from the encapsulant 5. The at least one photonic device 3 includes a light emitting diode chip 31 and a phosphor sheet 32 attached to the light emitting diode chip 31. In this embodiment, the light emitting diode chip 31 can emit a light having a first color (e.g., a blue light) that is mixed through the phosphor sheet 32 to form a light having a predetermined color (i.e., a second color).

Figure 4:
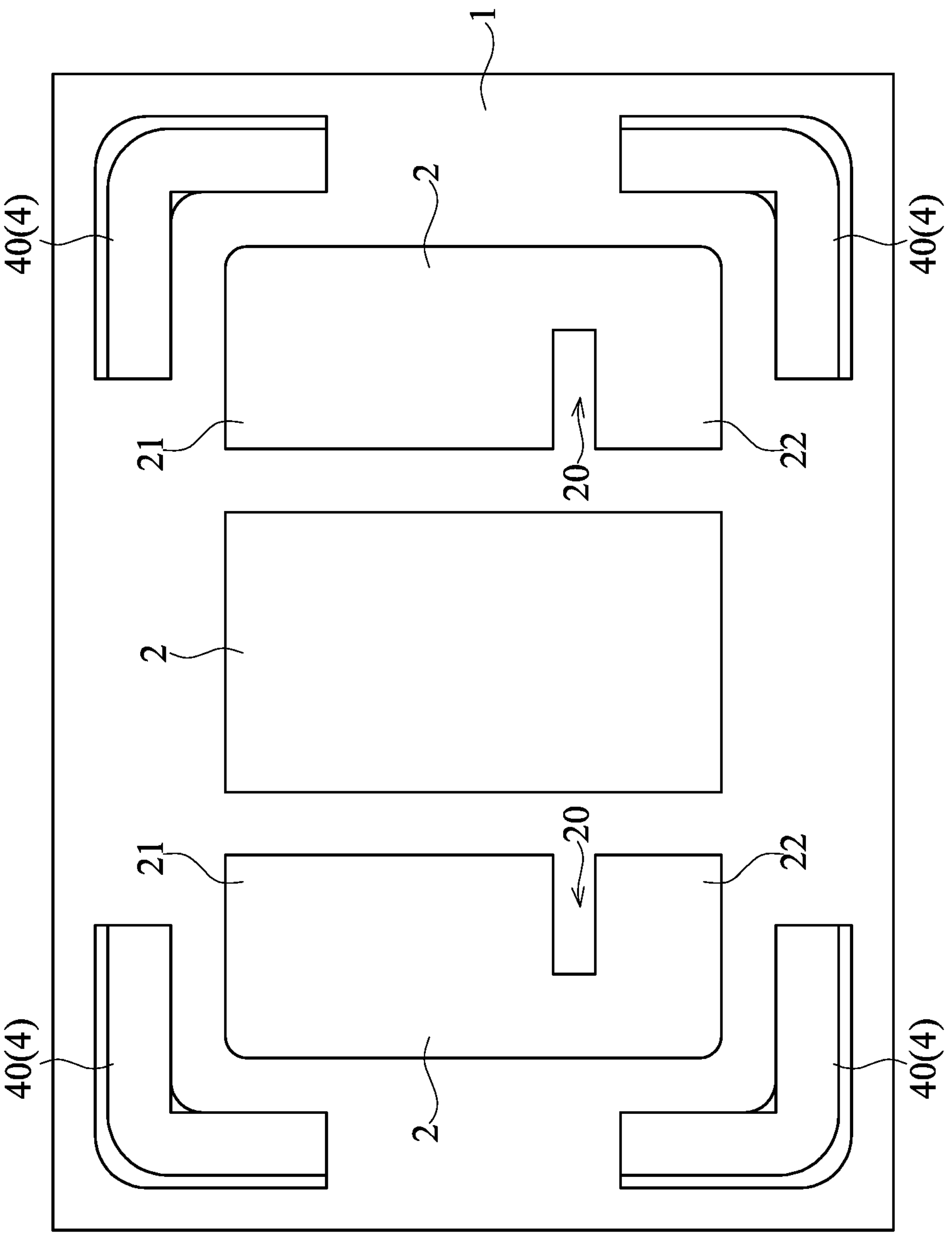
FIG. 4 is a top schematic view showing one implementation of a supporting frame of the package structure in the first embodiment of the present disclosure.

Referring to FIG. 3 and FIG. 4, it should be noted that, the supporting frame 4 can have various different implementations. In one of the implementations, the supporting frame 4 includes four portions 40 that are separate from (i.e., not connected to) each other, and the four portions 40 are all L-shaped. The four L-shaped portions 40 are respectively positioned on four corners of the substrate 1, and each of the L shapes of the four portions 40 exactly corresponds to each of four right angle corners of the substrate 1, respectively, and the four portions 40 are further combined into an open ring structure, wherein an outer surface of the corner of each of the four L-shaped portions 40 is preferably rounded or chamfered. A range of emitted light of the light having the mixed predetermined color (i.e., the second color) emitted by the at least one photonic device 3 can be concentrated through the four portions 40, thereby improving the luminous efficiency of the package structure Z.

Figure 5:
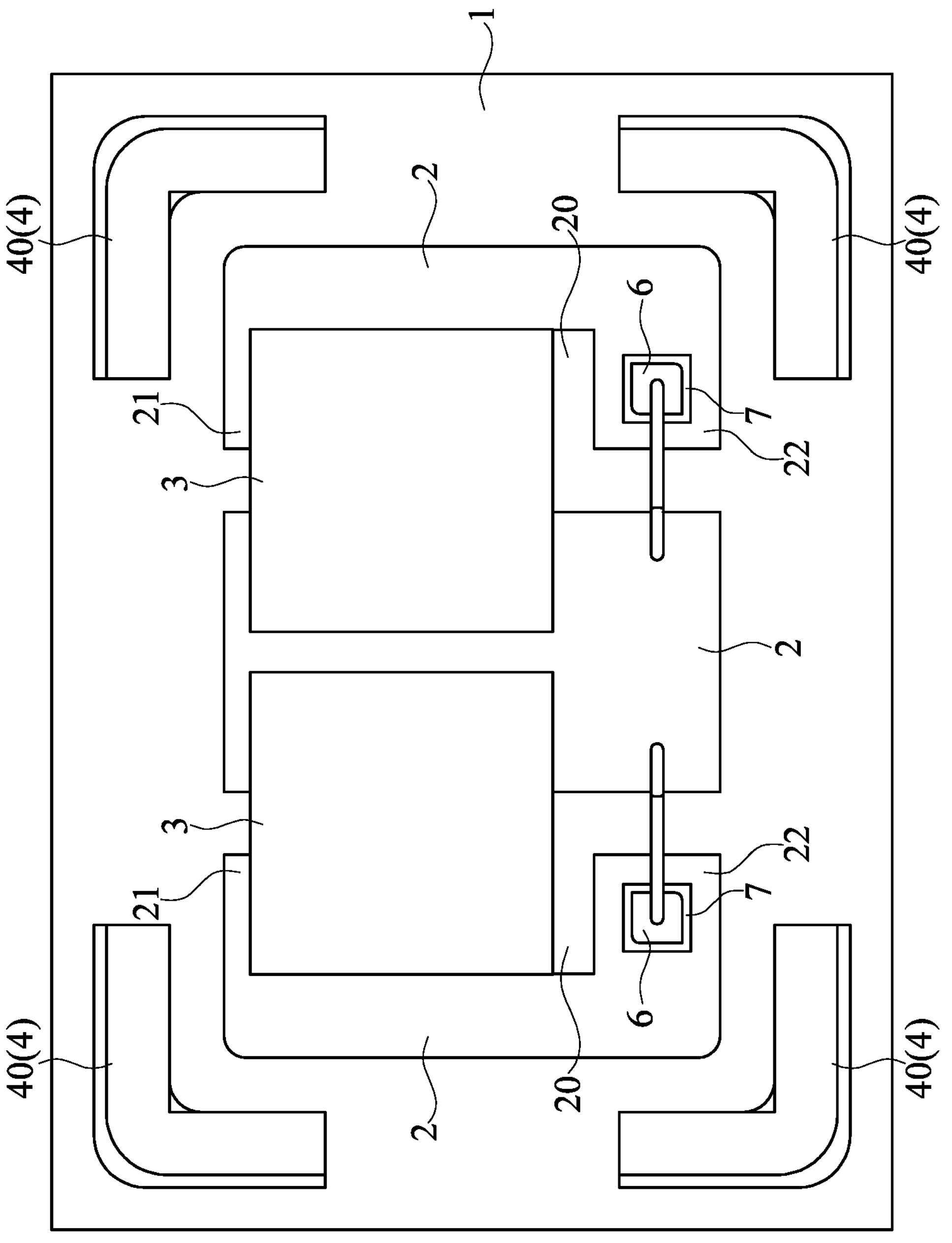
FIG. 5 is a top schematic view showing the supporting frame shown in FIG. 4 surrounding a photonic device and a Zener diode chip.
Figure 6:
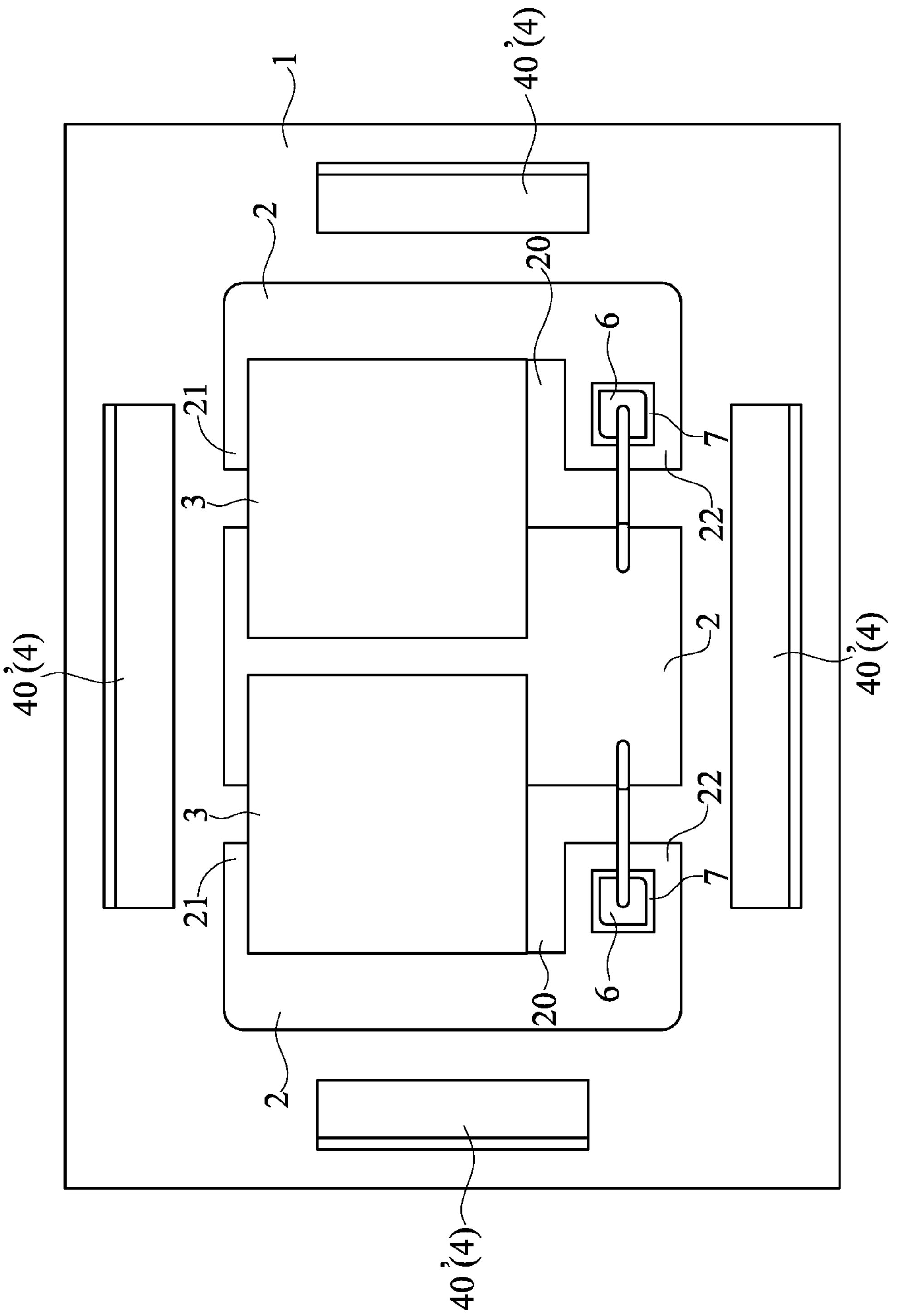
FIG. 6 is a top schematic view showing another implementation of a supporting frame of the package structure in the first embodiment of the present disclosure.

Reference is made to FIG. 6, and is to be read in conjunction with FIG. 3 to FIG. 5. FIG. 6 is a top schematic view showing another implementation of a supporting frame of the package structure in the first embodiment of the present disclosure. In another one of the implementations, the four portions 40' of the supporting frame 4 are all strip-shaped and separated from one another, and the four portions 40' are also further combined into an open ring structure. In one of the embodiments, the four strip-shaped portions 40' are respectively aligned with four sides of the substrate 1, two of the four portions 40' are arranged corresponding and symmetrical to each other, respectively, on two longer sides of the substrate 1, and another two of the four portions 40' are also arranged corresponding and symmetrical to each other, respectively, on two shorter sides of the substrate 1. The effect of improving the luminous efficiency of the four portions 40 shown in FIG. 6 are similar to that shown in FIG. 4, and will not be reiterated herein.

Furthermore, in one of the embodiments, the supporting frame 4 can include two portions (not shown in the figures) that are U-shaped and separated from each other, and the two portions are also combined into an open ring structure. It is worth mentioning that, a number of the portions (including the L-shaped portions 40, the strip-shaped portions 40', and the U-shaped portions) of the supporting frame 4 is not limited in the present disclosure, and shapes and combinations of the portions are not limited in the present disclosure, as long as the portions of the supporting frame 4 can be combined into an open ring. In other words, the supporting frame 4 includes at least two portions, and the portions can be L-shaped, strip-shaped, or U-shaped. For example, the supporting frame 4 can include eight portions, four of which are L-shaped and another four of which are strip-shaped, but the present disclosure is not limited thereto.

Figure 7:
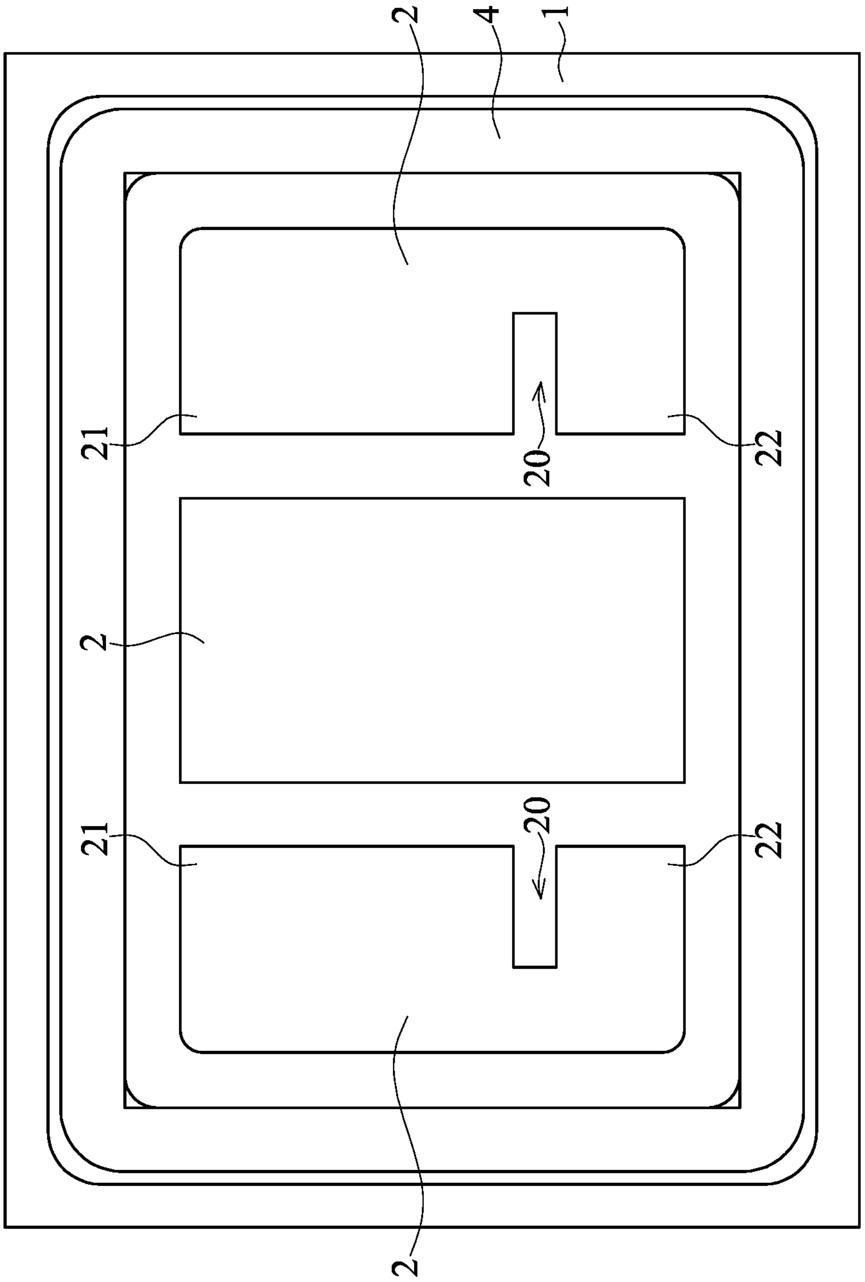
FIG. 7 is a top schematic view showing yet another implementation of a supporting frame of the package structure in the first embodiment of the present disclosure.
Figure 8:
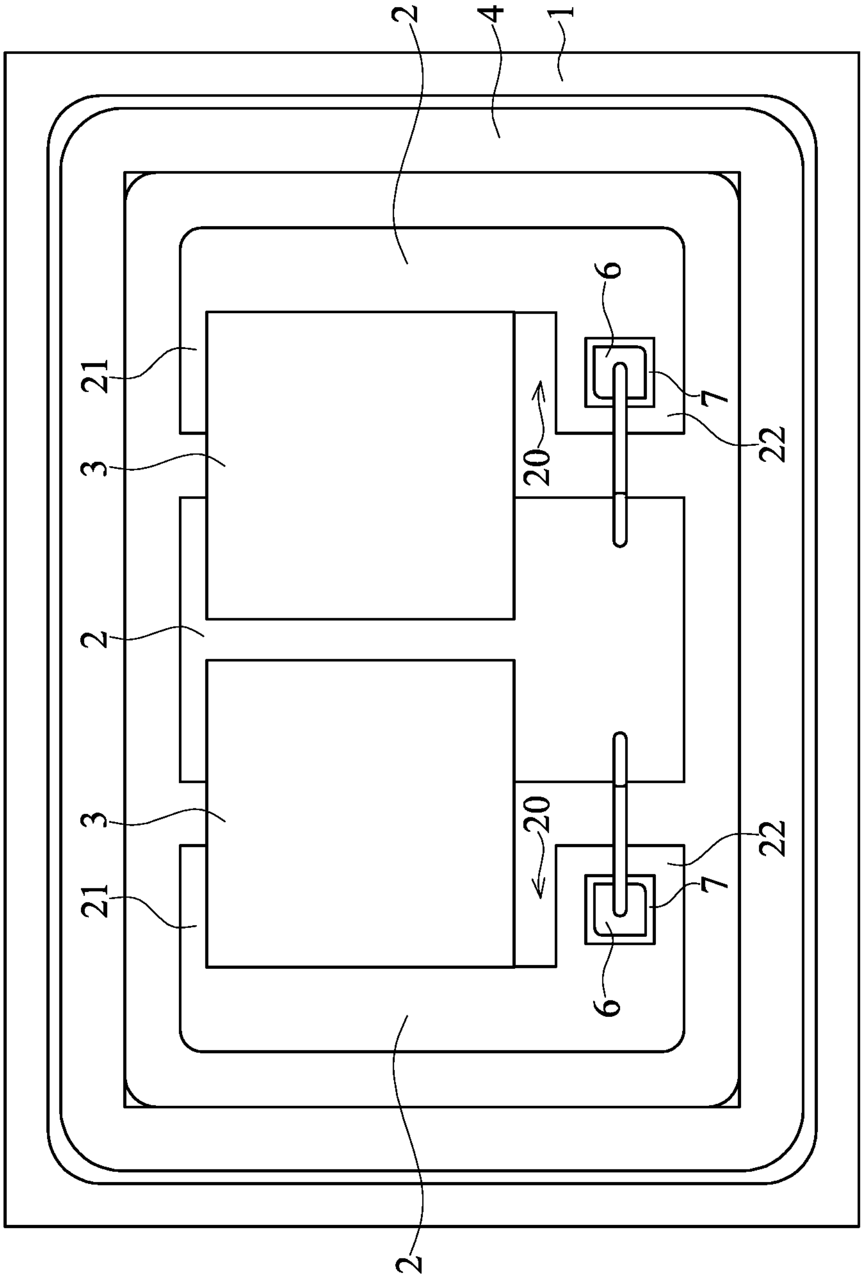
FIG. 8 is a top schematic view showing the supporting frame shown in FIG. 7 surrounding the photonic device and the Zener diode chip.

References are made to FIG. 7 and FIG. 8, in yet another one of the implementations, the supporting frame 4 is a closed ring structure. Compared with multiple portions (i.e., the four portions 40) in the open ring structure that are not connected to each other and that form an opening between two adjacent portions 40, in the closed ring structure, the supporting frame 4 is not divided into multiple portions, but is connected end to end. The range of emitted light of the light having the mixed predetermined color (i.e., the second color) emitted by the at least one photonic device 3 can be concentrated through the four portions 40, thereby improving the luminous efficiency of the package structure Z.

Referring to FIG. 5 and FIG. 8, since the at least one photonic device 3 is disposed on the at least one first metal pad 2, the quantity of the at least one first metal pad 2 is dependent on the quantity of the at least one photonic device 3. Specifically speaking, one photonic device 3 is disposed on two first metal pads 2. In this embodiment, the quantity of the at least one photonic device 3 is two, such that the quantity of first metal pads 2 is three, and the two outermost first metal pads 2 each have a slot-shaped groove 20. When the two photonic devices 3 are disposed on the three first metal pads 2, each of the slot-shaped grooves 20 is aligned with one side of the two photonic devices 3, respectively. More specifically, when a photonic device 3 on the left is disposed on the first metal pad 2 on the left and the first metal pad 2 in the middle, the slot-shaped groove 20 of the first metal pad 2 on the left is aligned with one side of the photonic device 3 on the left. When a photonic device 3 on the right is disposed on the first metal pad 2 on the right and the first metal pad 2 in the middle, the slot-shaped groove 20 of the first metal pad 2 on the right is aligned with one side of the photonic device 3 on the right.

Furthermore, the slot-shaped grooves 20 formed on the two outermost first metal pads 2 respectively separates each of the two outermost first metal pads 2 into a first accommodating portion 21 and a second accommodating portion 22, and the at least one photonic device 3 is disposed in the first accommodating portion 21. In addition, the package structure Z further includes a Zener diode chip 6, and the Zener diode is an electronic component having a voltage stabilizing function. In this embodiment, two Zener diode chips 6 are respectively fixed on the second accommodating portions 22 of the two outermost first metal pads 2 by die bonding adhesive 7 (e.g., silver adhesive). The slot-shaped groove 20 is an I-shaped groove structure, which has two functions: positioning the at least one photonic device 3, such that the slot-shaped groove 20 is aligned with one side of the at least one photonic device 3; and separating the at least one photonic device 3 and the Zener diode chip 6 from each other, so as to prevent an excessive amount of the die bonding adhesive 7 for fixing the Zener diode chips 6 from overflowing and contacting the at least one photonic device 3, thereby disturbing the manufacturing process.

Reference is further made to FIG. 2, in which the supporting frame 4 is a multi-layer structure manufactured through a photolithography process, and through electroforming and then stacking metal materials. In other words, the supporting frame 4 is a multi-layer stacked metal frame structure that includes a metal layer 41 on a lower side and a plurality of metal layers 42 on an upper side. A quantity of layers of the metal layers 42 can be at least two, but the present disclosure does not limit the quantity of the layers.

It should be noted that, in practice, the supporting frame 4 can be tapered from bottom to top, and be trapezoid-shaped or substantially trapezoid-shaped. In addition, as shown in FIG. 2, a tapered side of the supporting frame 4 (i.e., a tapered side of a trapezoid that is not vertical) is facing toward an edge of the carrier C and away from the at least one photonic device 3; that is, the tapered side of the supporting frame 4 is adjacent to the edge of the substrate 1 and the supporting frame 4 is tapered outwardly. However, it should be noted that, an outer edge of the supporting frame 4 does not exceed the edge of the carrier C (i.e., the substrate 1), such that the supporting frame 4 is covered by and not exposed from the encapsulant 5. That is to say, a distance is defined between the outer edge of the supporting frame 4 and the edge of the carrier C. A width difference W between the lowermost metal layer 41 and an uppermost one of the metal layers 42 is at least 0.05 mm. In practice, when the metal layer 41 and the metal layers 42 are electroformed and then stacked into a multi-layer structure, and widths of the upper and lower metal layers 42 and 41 are identical, an exposure misalignment is likely to occur, causing a problem of multi-layer dislocation. Therefore, through having the width difference W, widths of the metal layers 42 on the upper side are smaller than that of the metal layer 41. That is to say, the upper metal layer 42 and lower metal layers 41 are allowed to have a tolerance to avoid the exposure misalignment, and prevent a potential problem of multi-layer dislocation of the structure of the supporting frame 4 that can be caused by the exposure misalignment.

A height difference H1 is between the top surface of the encapsulant 5 and the top of the supporting frame 4, and the height difference H1 is not greater than half of a height H2 of the encapsulant 5. In other words, a height of the supporting frame 4 can be taller than or equal to half of a height of the encapsulant 5. Preferably, in this embodiment, the height difference H1 between the top surface of the encapsulant 5 and the top of the supporting frame 4 is substantially one third of the height H2 of the encapsulant 5. The height difference H1 between the encapsulant 5 and the supporting frame 4 is designed to increase a buffering effect, strengthen a supportability of the encapsulant 5, and prevent the encapsulant 5 from being crushed by a suction nozzle during a mounting process, causing rupture of the encapsulant 5.

A first distance D1 is between two adjacent ones of the at least one first metal pad 2, and the first distance D1 is at least 0.05 mm. A second distance D2 is between the supporting frame 4 and an adjacent one of the at least one first metal pad 2, and the second distance D2 is at least 0.05 mm. A third distance D3 is between the outer edge of the supporting frame 4 and an edge of the carrier C, and the third distance D3 is at least 0.05 mm. It should be noted that, as shown in FIG. 2, since the carrier C includes the substrate 1 and the at least one first metal pad 2, the third distance D3 is also a distance between the outer edge of the supporting frame 4 and the edge of the substrate 1, which is at least 0.05 mm. The distances D1, D2, and D3 are designed to prevent infiltration from occurring to the metal frame (i.e., the supporting frame 4) during the electroforming process, thereby preventing the metal frame (i.e., the supporting frame 4) from being electrically connected with the at least one first metal pad 2 that cause the metal frame to be electrified.

Figure 9:
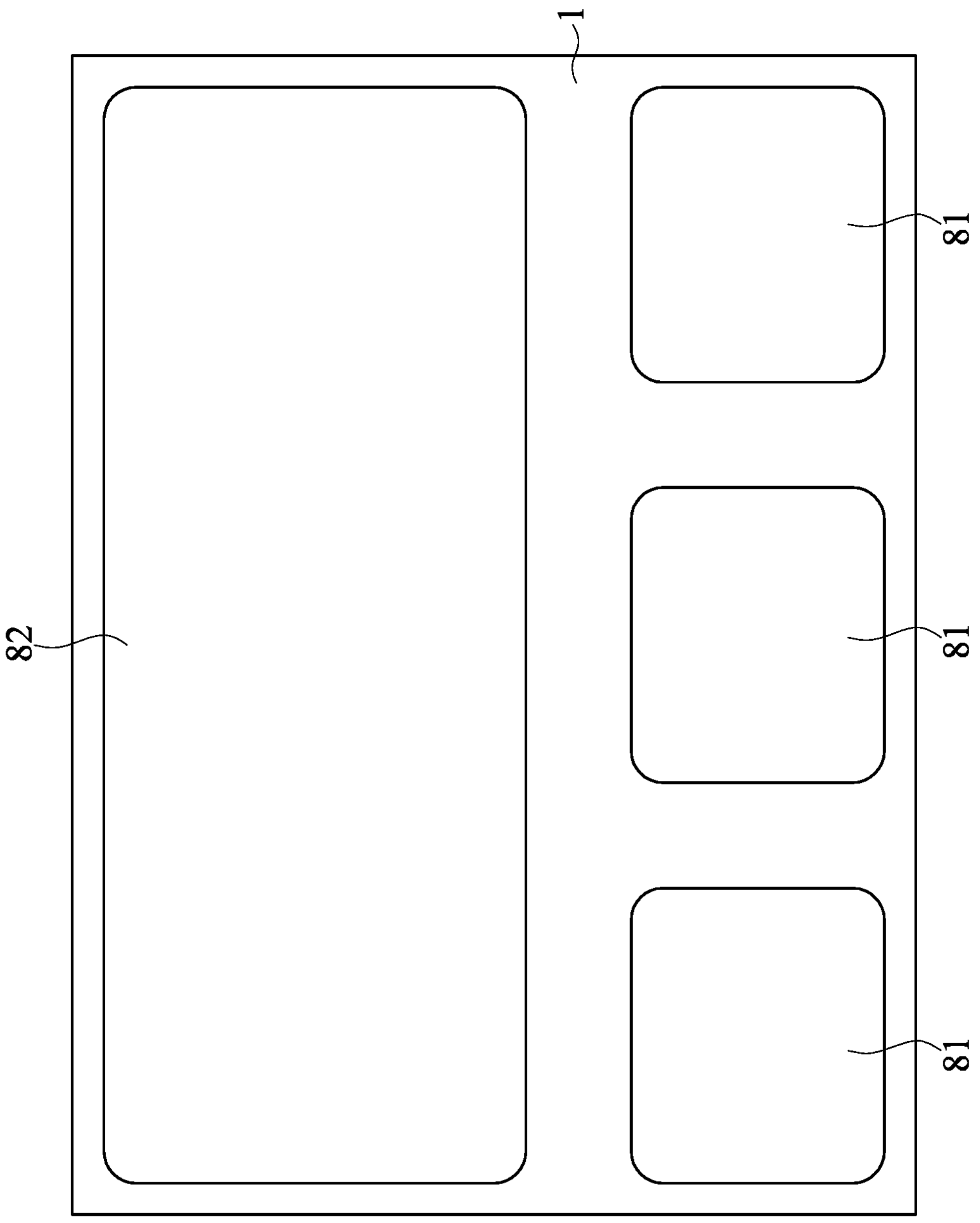
FIG. 9 is a bottom schematic view of the package structure in the first embodiment of the present disclosure.

Referring to FIG. 1, FIG. 2 and FIG. 9, the package structure Z further includes a second metal pad 8. The second metal pad 8 is disposed on the carrier C, and the second metal pad 8 and the at least one first metal pad 2 are respectively disposed on opposite sides of the carrier C. Specifically speaking, the second metal pad 8 and the at least one first metal pad 2 are electrically connected to each other through perforating and filling metal material in the substrate 1 (not shown in the figures). During the mounting process, the package structure Z is soldered to a circuit board through the second metal pad 8. The second metal pad 8 includes at least one conductive portion 81 and a heat dissipation portion 82. An area of the heat dissipation portion 82 is larger than that of the at least one conductive portion 81, and the at least one conductive portion 81 and the at least one first metal pad 2 are electrically connected to each other through the metal material filled in the substrate 1. The second metal pad 8, similar to the supporting frame 4, is a multi-layer structure that is electroformed and then stacked with a metal material. In this embodiment, the second metal pad 8 is a two-layer stacked structure. In addition, a height ratio of the supporting frame 4 to the second metal pad 8 is between 2 and 4, which can avoid a difference in the coefficient of thermal expansion (CTE) due to a larger difference in the quantity of layers manufactured through electroforming, and prevent brittle fractures from forming in the substrate 1 that is sandwiched in the middle (assuming that the substrate 1 is made of ceramic material).

In this embodiment, a quantity of the at least one conductive portion 81 can be three, and the at least one conductive portion 81 can be arranged side by side to the heat dissipation portion 82 on a same side of the substrate 1. Since the area of the heat dissipation portion 82 is larger than the area of the at least one conductive portion 81, when the package structure Z is conducted (with current) with the at least one first metal pad 2 through the at least one conductive portion 81, the relatively large area of the heat dissipation portion 82 can increase the heat dissipation area and reduce an overall thermal resistance of the package structure Z. In addition, in this embodiment, the two outermost first metal pads 2 are anodes, and the first metal pad 2 in the middle is a cathode. The two outermost conductive portions 81 of the second metal pad 8 are cathodes, and the conductive portion 81 that is sandwiched in middle is an anode.

Second Embodiment

Figure 10:
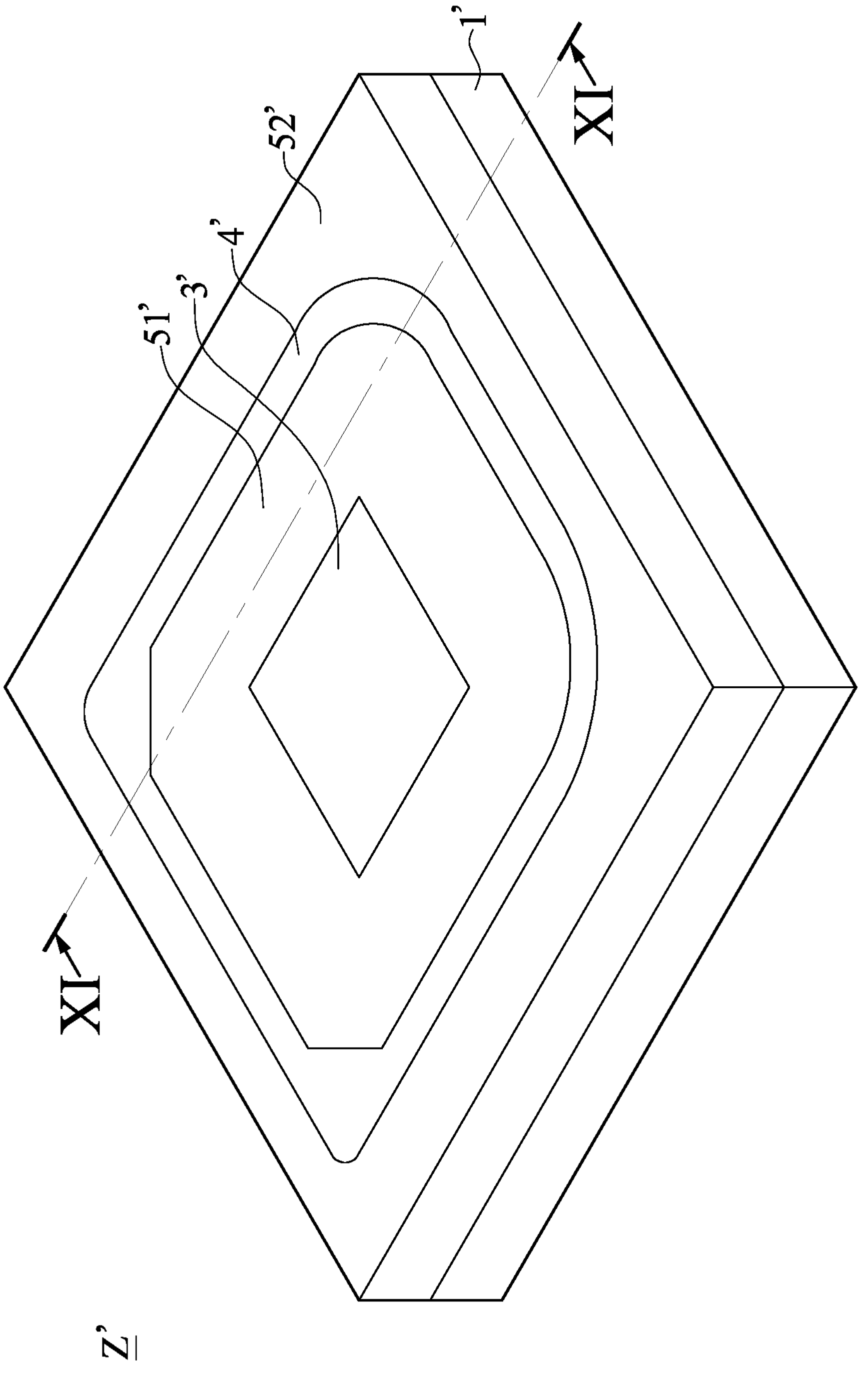
FIG. 10 is a perspective schematic view of the package structure in a second embodiment of the present disclosure.
Figure 11:
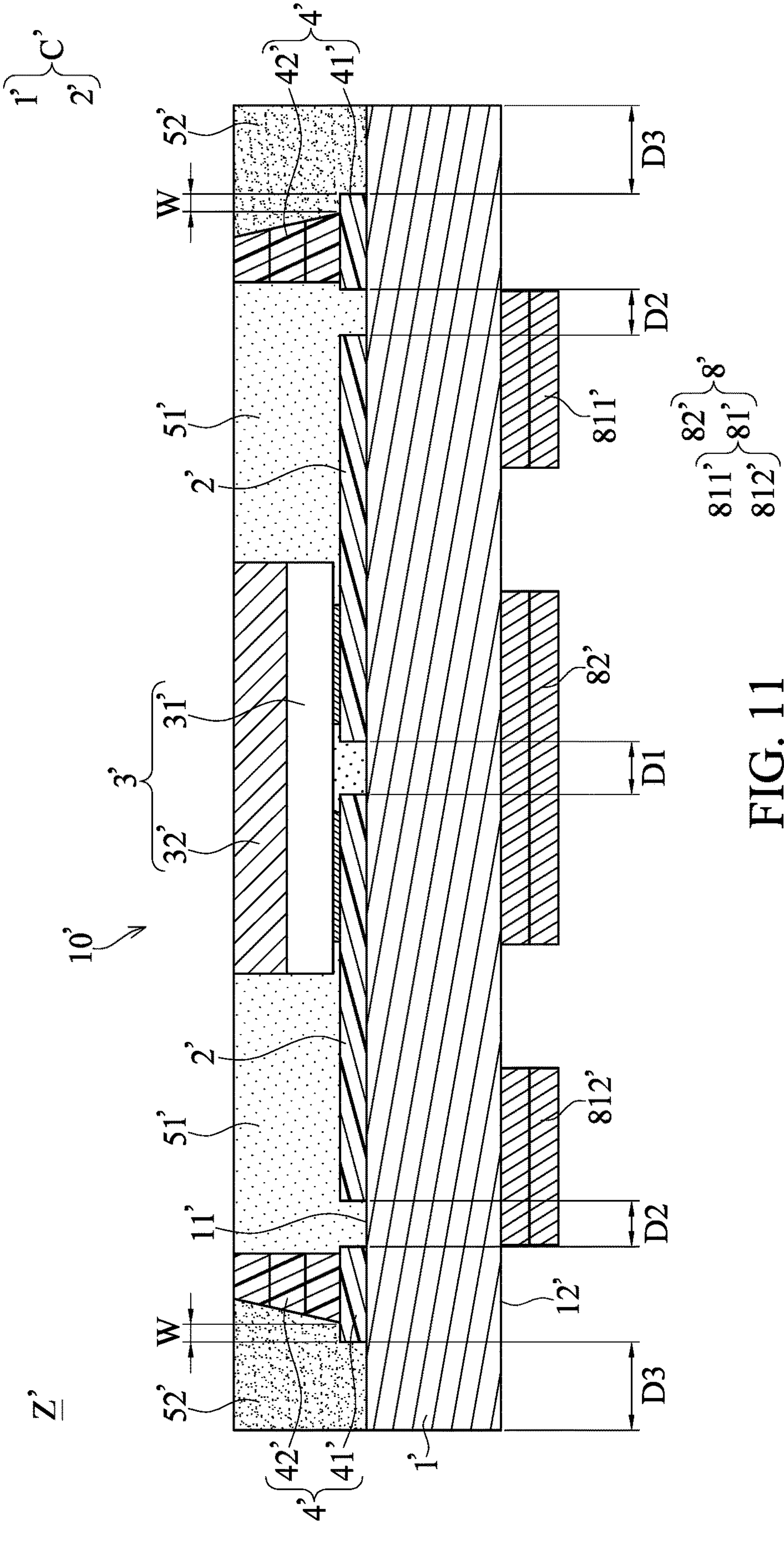
FIG. 11 is a cross-sectional view taken along line XI-XI of FIG. 10.
Figure 12:
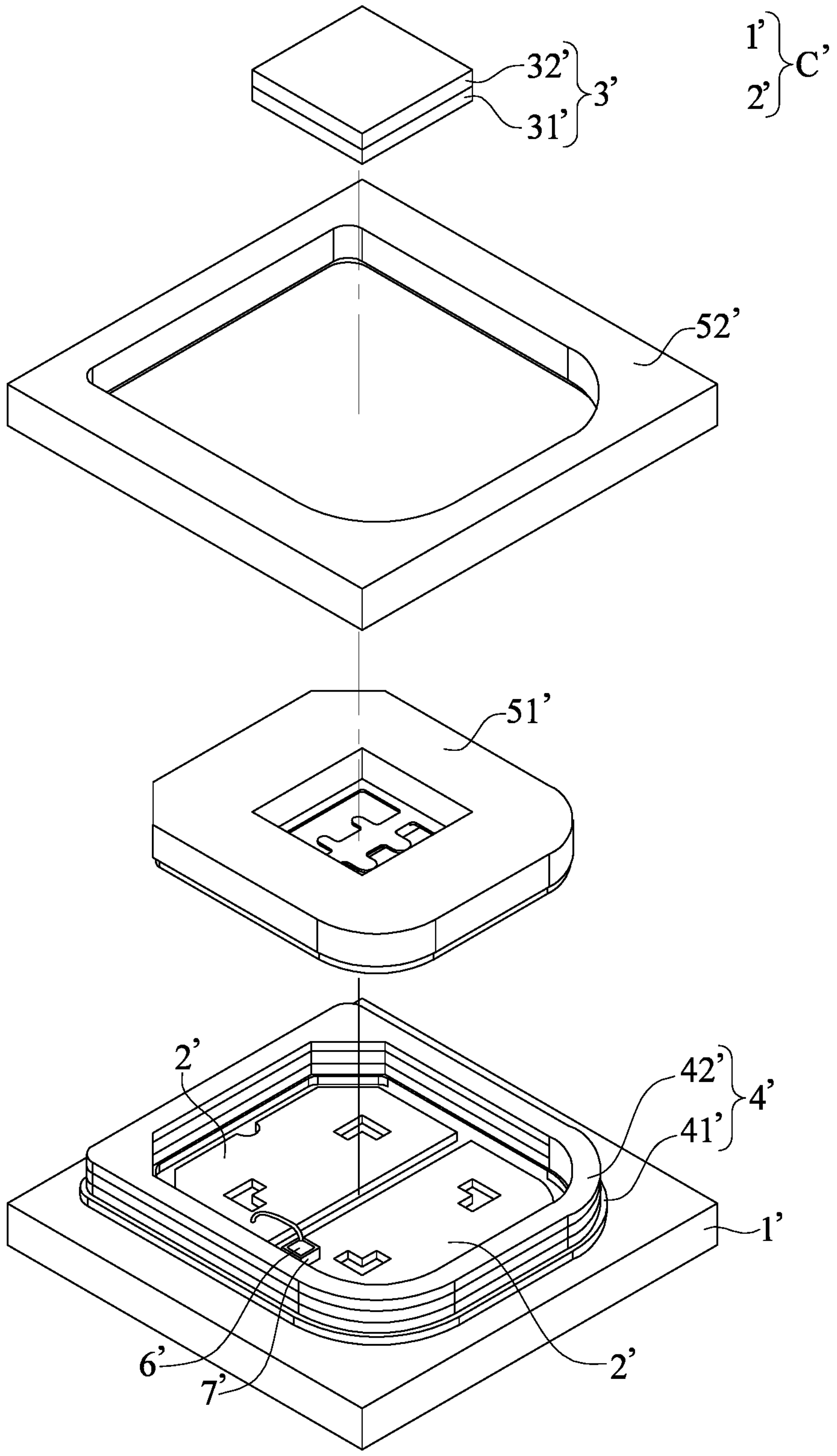
FIG. 12 is an exploded perspective schematic view of the package structure in the second embodiment of the present disclosure.

Referring to FIG. 10, FIG. 11 and FIG. 12, a package structure Z' is provided in the second embodiment of the present disclosure, and includes a carrier C', at least one photonic device 3', a supporting frame 4', a first encapsulant 51', and a second encapsulant 52'. The at least one photonic device 3' is disposed on the carrier C'. The supporting frame 4' is disposed on the carrier C', the supporting frame 4' surrounds the at least one photonic device 3', an accommodating space 10' is formed between the supporting frame 4' and the carrier C', and the at least one photonic device 3' is positioned in the accommodating space 10'.

Specifically speaking, the carrier C' includes a substrate 1' and a plurality of first metal pads 2', and the material of the substrate 1' can be, for example, a ceramic material, but the present disclosure is not limited thereto. The substrate 1' includes a first surface 11' and a second surface 12' that are opposite to each other. The first metal pads 2' are disposed on the first surface 11', and the at least one photonic device 3' is disposed on the first metal pads 2'. In this embodiment, the at least one photonic device has a quantity of one (i.e., single chip), but the present disclosure is not limited thereto, and the quantity of the at least one photonic device 3' can be one or more than one.

More specifically, the supporting frame 4' is disposed on the substrate 1' and an accommodating space 10' is formed between the supporting frame 4' and the substrate 1', and the first metal pads 2' and the photonic device 3' are disposed in the accommodating space 10'. The first encapsulant 51' is filled in the accommodating space 10', and a top of the photonic device 3' is exposed from the first encapsulant 51'. It should be noted that, in the present disclosure, a height of the first encapsulant 51' is identical to that of the supporting frame 4', that is, a top of the first encapsulant 51' is flush with the top of the supporting frame 4'. However, the present disclosure is not limited thereto. For example, the first encapsulant 51' can be completely covered on the supporting frame 4'.

The photonic device 3' includes a light emitting diode chip 31' and a phosphor sheet 32' attached to the light emitting diode chip 31'. In this embodiment, the light emitting diode chip 31' can emit a light having a first color (e.g., a blue light) that is mixed through the phosphor sheet 32' to form a light having a mixed predetermined color (i.e., a second color). The supporting frame 4' is designed to strengthen the supportability of the first encapsulant 51' and to provide a buffering effect, which improves a problem of the first encapsulant 51' being easily crushed by a suction nozzle during a mounting process, thereby preventing leakage of blue light caused by rupture. In addition, a range of emitted light of the light having the mixed predetermined color (i.e., the second color) generated through the photonic device 3' can be concentrated through the supporting frame 4', thereby improving the luminous efficiency of the package structure Z.

The second encapsulant 52' is formed on an outer edge of the supporting frame 4', which is formed by plastic injection with a plastic material. The first encapsulant 51' is made by dispensing white resin containing epoxy resin. In other words, the first encapsulant 51' and the second encapsulant 52' are different in materials and manufacturing methods.

Figure 13:
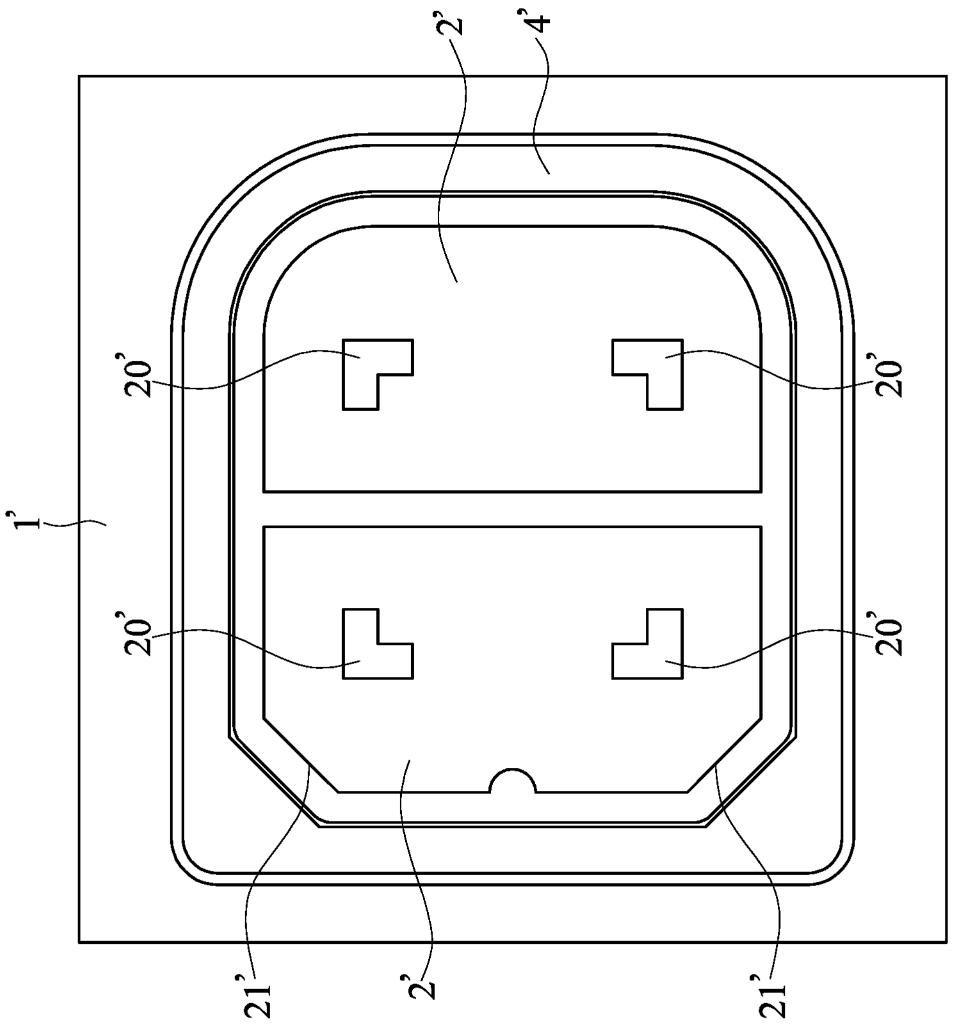
FIG. 13 is a top schematic view of the supporting frame of the package structure in the second embodiment of the present disclosure.
Figure 14:
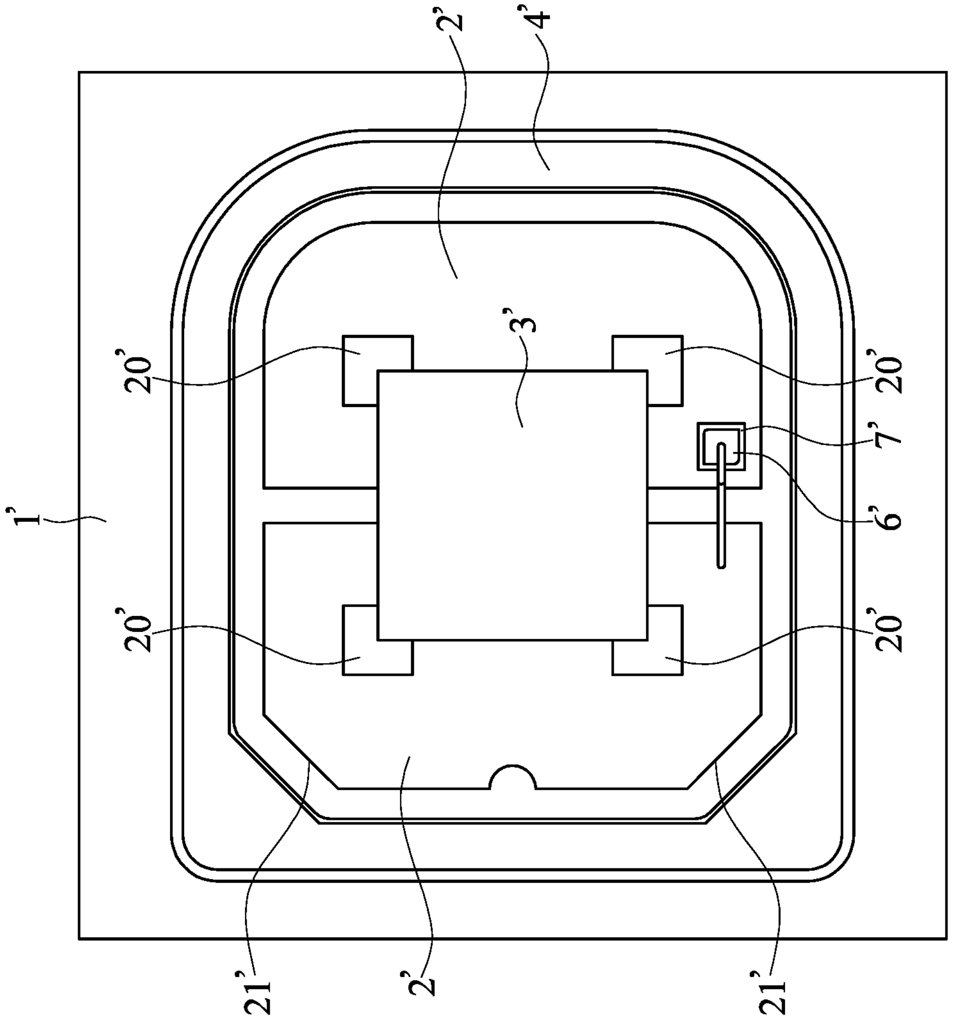
FIG. 14 is a top schematic view showing the supporting frame shown in FIG. 12 surrounding the photonic device and the Zener diode chip.

Referring to FIG. 13 and FIG. 14, since the photonic device 3' is disposed on the first metal pads 2', the quantity of the first metal pads 2' is dependent on the quantity of the photonic device 3'. In this embodiment, one photonic device 3' is disposed on two first metal pads 2'. Each of the two first metal pads 2' has two L-shaped grooves 20' formed thereon, and the two first metal pads 2' have four L-shaped grooves 20' in total. As shown in FIG. 13, the four L-shaped grooves 20' are disposed symmetrically with one another to mark a die mounting area. As shown in FIG. 14, when the photonic device 3' is disposed on the two first metal pads 2', the L-shaped grooves 20' are aligned with four corners of the photonic device 3'. In other words, the L-shaped grooves 20' are used to position the photonic device 3'.

Reference is further made to FIG. 13, one of the two first metal pads 2' on the left includes a first identification portion 21'. More specifically, the first identification portions 21' are disposed on two ends of one side of the first metal pads 2' that is adjacent to the supporting frame 4', respectively, and shapes of the first identification portions 21' correspond to the supporting frame 4'. The first identification portions 21' are used to identify polarities, with one of the two first metal pads 2' having the first identification portions 21' being a cathode, and another one of the two first metal pads 2' without the first identification portions 21' being an anode.

Reference is further made to FIG. 14, the package structure Z' further includes a Zener diode chip 6', and the Zener diode chip 6' is fixed on the first metal pads 2' serving as the anode through die bonding adhesive 7' (e.g., silver adhesive), and is connected to the first metal pads 2' serving as the cathode through wire bonding.

Reference is further made to FIG. 11, in which a first distance D1 is between two adjacent first metal pads 2', and the first distance D1 is at least 0.05 mm. A second distance D2 is between the supporting frame 4' and an adjacent one of the first metal pads 2', and the second distance D2 is at least 0.05 mm. A third distance D3 is between an outer edge of the supporting frame 4' and an edge of the carrier C', and the third distance D3 is at least 0.05 mm. It should be noted that, as shown in FIG. 11, since the carrier C' includes the substrate 1' and the first metal pads 2', the third distance D3 is also a distance between the outer edge of the supporting frame 4' and the edge of the substrate 1', which is at least 0.05 mm. The distances D1, D2, and D3 in this embodiment are designed for the same purpose as that in the first embodiment, and will not be reiterated herein.

In addition, similar to that in the first embodiment, the supporting frame 4' is a multi-layer structure manufactured through a photolithography process and through electroforming and then stacking metal materials, and the supporting frame 4' can be tapered from bottom to top, and be trapezoid-shaped or substantially trapezoid-shaped. In other words, in practice, the supporting frame 4' is a multi-layer stacked metal frame structure that includes a metal layer 41' on a lower side and a plurality of metal layers 42' on an upper side. A width difference W between the lowermost metal layer 41' and an uppermost one of the metal layers 42' is at least 0.05 mm. Similarly, the structural design of the supporting frame 4' in this embodiment is designed for the same purpose as that of the first embodiment, and will not be reiterated herein.

Figure 15:
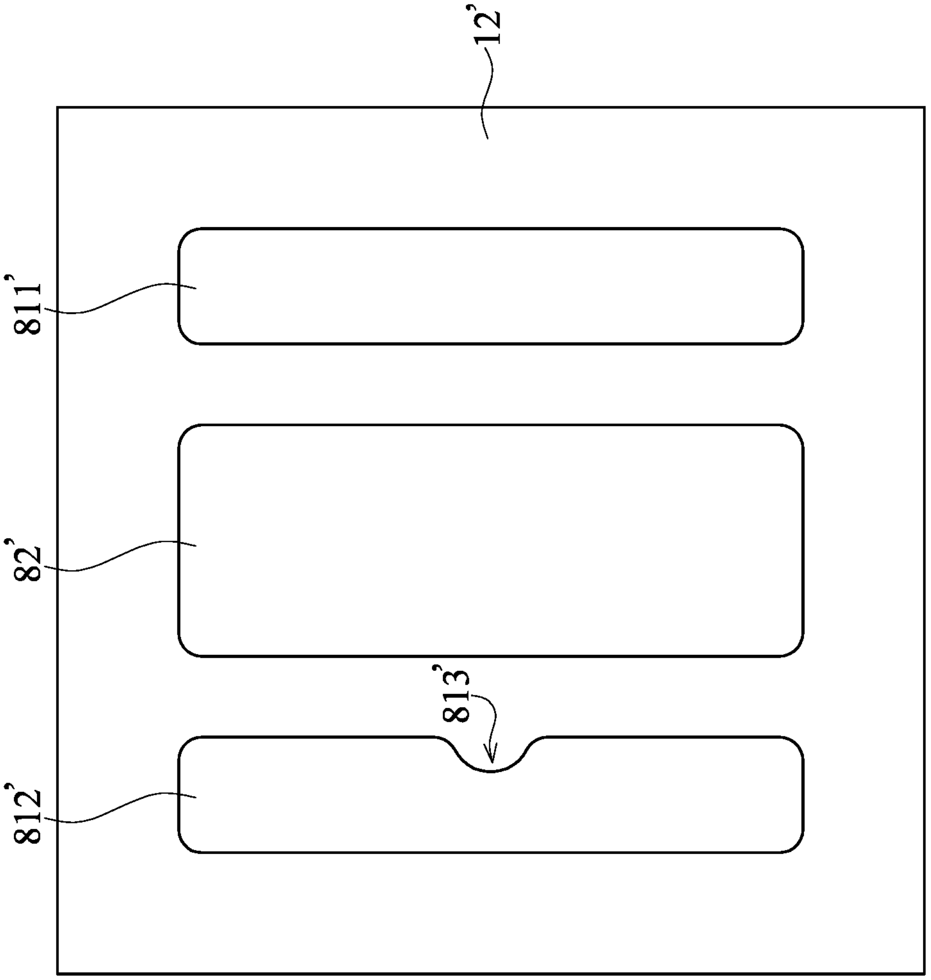
FIG. 15 is a bottom schematic view of the package structure in the second embodiment of the present disclosure.

Referring to FIG. 11 and FIG. 15, the package structure Z' further includes a plurality of second metal pads 8'. The second metal pads 8' are disposed on the carrier C', and the second metal pads 8' and the first metal pads 2' are respectively disposed on opposite sides of the carrier C'. Specifically speaking, the second metal pads 8' are disposed on a second side surface 12' of the substrate 1', and the second metal pads 8' and the first metal pads 2' are electrically connected to one another through perforating and filling metal material in the substrate 1' (not shown in the figures). During the manufacturing process, the package structure Z' is soldered to a circuit board through the second metal pads 8'.

In this embodiment, a thickness of the second metal pads 8' is greater than a thickness of the first metal pads 2'. Each of the second metal pads 8' includes at least one conductive portion 81' and a heat dissipation portion 82', and an area of the heat dissipation portion 82' is larger than that of the at least one conductive portion 81'. In another embodiment, a quantity of the at least one conductive portion 81' can be two, and one of the two conductive portions 81' includes a second identification portion 813'. The second identification portion 813' is used to identify polarities, and is similar to the first identification portions 21'. One of the two conductive portions 81' having the second identification portion 813' is a cathode, and another one of the two conductive portions 81' without the second identification portion 813' is an anode. Therefore, in other words, the two conductive portions 81' include an anode portion 811' and a cathode portion 812'. The heat dissipation portion 82' is positioned between the anode portion 811' and the cathode portion 812'. The second metal pad 8' is formed by electroforming and then stacking a metal material into a multi-layer structure. In this embodiment, each of the second metal pads 8' is a two-layer stacked structure. In addition, the height ratio of the supporting frame 4' to the second metal pad 8' is between 2 and 4, which can avoid a difference in the coefficient of thermal expansion (CTE) due to an excessive difference in the quantity of layers manufactured through electroforming, and prevent brittle fractures from forming in the substrate 1' that is sandwiched in the middle (assuming that the substrate 1' is made of ceramic material).

In addition, in this embodiment, the second metal pads 8' also adopt a thermoelectric separation structure design. That is to say, at least one of the conductive portion 81' is used to conduct electricity, and the large area of the heat dissipation portion 82' can increase the heat dissipation area and reduce an overall thermal resistance of the package structure Z'. The effect of the conductive portion 81' is the same as that in the first embodiment, and will not be reiterated herein.

Beneficial Effects of the Embodiments

One of the beneficial effects of the present disclosure is that the package structures Z and Z' provided by the present disclosure can improve the structural strength of the package structure and enhance the supportability of the encapsulant through the technical solution of "the supporting frame 4', 4 surrounding the carrier C, C'".

Furthermore, a blade thrust test is respectively performed on the package structures Z, Z' of the present disclosure and the conventional package structure to compare a maximum thrust that the encapsulant can withstand with or without a supporting frame structure. According to the test results, the encapsulant of the conventional package structure without a supporting frame structure can withstand a maximum thrust of 586.6 grams. On the other hand, the encapsulant 5, 5' of the package structure Z, Z' having the supporting frame 4, 4' in the present disclosure can withstand a maximum thrust of 997.1 grams. Moreover, the encapsulant 5, 5' within the area surrounded by the supporting frame 4, 4' can withstand a maximum thrust of up to 2106.6 grams. In other words, compared with the conventional package structure, the supporting frame 4, 4' of the package structure Z, Z' of the present disclosure can greatly enhance the supportability of the encapsulant 5, 5' and prevent the encapsulant 5, 5' from being crushed by the suction nozzle during a mounting process, causing rupture of the encapsulant 5, 5'.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A package structure, comprising:

a carrier including a substrate and a plurality of first metal pads and second metal pads, wherein the substrate includes a first surface and a second surface that are opposite to each other, the first metal pads are disposed on the first surface, the second metal pads are disposed on the second surface, and a thickness of each of the second metal pads is greater than that of each of the first metal pads;

a frame disposed on the carrier, an accommodating space being formed between the frame and the carrier, wherein the frame is a multilayer stacked metal frame structure, the frame includes a lower metal layer and a plurality of upper metal layers formed on the lower metal layer, and the lower metal layer and the plurality of upper metal layers have width differences from each other; and at least one photonic device disposed in the accommodating space;

wherein a height ratio of the frame to each of the second metal pads is between 2 and 4.

2. The package structure according to claim 1, wherein the second metal pad is a multi-layer structure.

3. The package structure according to claim 1, wherein a distance is defined between an edge of the carrier and an outer edge of the frame, and another distance is defined between the edge of the carrier and an outer edge of the second metal pad.

4. The package structure according to claim 1, wherein the frame is a closed ring structure.

5. The package structure according to claim 1, wherein a distance is between the frame and an adjacent one of the first metal pads is greater than or equal to 0.05 millimeters.

6. The package structure according to claim 1, wherein the frame is tapered from bottom to top, and a tapered side of the frame is facing away from the at least one photonic device.

7. The package structure according to claim 1, further comprising an encapsulant covering the frame.

8. The package structure according to claim 7, wherein a height difference between the top surface of the encapsulant and the frame is not greater than half of a height of the encapsulant.

9. The package structure according to claim 1, further comprising:

a first encapsulant filled in the accommodating space; and a second encapsulant formed around an outer edge of the frame.

10. The package structure according to claim 1, wherein each of the second metal pads includes at least two conductive portions and a heat dissipation portion, an area of the heat dissipation portion is larger than that of the at least two conductive portions.

11. A package structure, comprising:

a carrier including at least two first metal pads;

at least one photonic device disposed on the carrier; and a frame disposed on the carrier and surrounding the at least one photonic device, wherein the frame is not in electrical contact with the first metal pads;

wherein the frame is a multi-layer metal structure which is tapered from bottom to top, and a tapered side of the frame is facing away from the at least one photonic device;

wherein the frame includes a lower metal layer and a plurality of upper metal layers formed on the lower metal layer, and the lower metal layer and the plurality of upper metal layers have width differences from each other;

wherein a distance is defined between an outer edge of the frame and the edge of the carrier.

12. The package structure according to claim 11, wherein the carrier includes a substrate, a first distance is between each two of the at least two first metal pads that are adjacent to each other, a second distance is between the frame and an adjacent one of the at least two first metal pads, a third distance is between an outer edge of the frame and an edge of the carrier, and the first distance, the second distance, and the third distance are all greater than or equal to 0.05 millimeters.

13. The package structure according to claim 11, further comprising an encapsulant covering the frame.

14. The package structure according to claim 13, wherein a height difference between the top surface of the encapsulant and the frame is not greater than half of a height of the encapsulant.

15. The package structure according to claim 13, wherein a top side of the at least one photonic device is exposed from the encapsulant.

16. The package structure according to claim 11, further comprising:

a first encapsulant disposed between the frame and the at least one photonic device, and a second encapsulant formed around an outer edge of the frame.

17. A package structure, comprising:

a carrier including a substrate and a plurality of first metal pads;

a frame disposed on the carrier, an accommodating space being formed between the frame and the carrier, wherein the frame includes a lower metal layer and a plurality of upper metal layers formed on the lower metal layer, and the lower metal layer and the plurality of upper metal layers have width differences from each other; and at least one photonic device disposed in the accommodating space;

wherein a first distance is between two of the first metal pads that are adjacent to each other, a second distance is between the frame and an adjacent one of the first metal pads, a third distance is between the outer edge of the frame and an edge of the carrier, and the first distance, the second distance, and the third distance are all greater than or equal to 0.05 millimeters.

* * * * *